United States Patent
Kordic et al.

(10) Patent No.: US 6,917,116 B2
(45) Date of Patent: Jul. 12, 2005

(54) ELECTRICAL CONNECTION DEVICE BETWEEN TWO TRACKS OF AN INTEGRATED CIRCUIT

(75) Inventors: Srdjan Kordic, Bernin (FR); Céline Roussel, St Martin d'Héres (FR); Alain Inard, St Nazaire les Eymes (FR)

(73) Assignees: STMicroelectronics SA, Montrouge (FR); Koninklike Philips Electronics, Eindhoven (NL)

( * ) Notice: Subject to any disclaimer, the term of this patent is extended or adjusted under 35 U.S.C. 154(b) by 0 days.

(21) Appl. No.: 10/714,442

(22) Filed: Nov. 14, 2003

(65) Prior Publication Data

US 2004/0140565 A1 Jul. 22, 2004

(30) Foreign Application Priority Data

Nov. 14, 2002 (FR) .................................... 02 14242

(51) Int. Cl.⁷ .............................................. H01L 23/48
(52) U.S. Cl. ...................... 257/774; 257/773; 257/781
(58) Field of Search ................................ 257/774, 734, 257/748, 758, 773, 784

(56) References Cited

U.S. PATENT DOCUMENTS

| | | | | | |
|---|---|---|---|---|---|
| 5,434,452 A | * | 7/1995 | Higgins, III | ................ | 257/773 |
| 5,446,311 A | * | 8/1995 | Ewen et al. | ................ | 257/531 |
| 5,457,344 A | * | 10/1995 | Bartelink | ................ | 257/737 |
| 5,502,337 A | * | 3/1996 | Nozaki | ................ | 257/773 |
| 5,739,587 A | * | 4/1998 | Sato | ................ | 257/758 |
| 5,831,219 A | | 11/1998 | Kobayashi et al. | | |
| 5,932,928 A | | 8/1999 | Clampitt | | |
| 6,207,553 B1 | * | 3/2001 | Buynoski et al. | ............ | 438/622 |
| 6,218,282 B1 | * | 4/2001 | Buynoski | ................ | 438/619 |
| 6,297,563 B1 | * | 10/2001 | Yamaha | ................ | 257/781 |
| 6,501,181 B2 | * | 12/2002 | Albinsson | ................ | 257/774 |
| 6,661,041 B2 | * | 12/2003 | Keeth | ................ | 257/211 |
| 6,774,024 B2 | * | 8/2004 | Miyamoto et al. | .......... | 438/597 |
| 2002/0048942 A1 | | 4/2002 | Yamaguchi | | |
| 2002/0089059 A1 | | 7/2002 | Imai | | |
| 2004/0008466 A1 | * | 1/2004 | Anthony et al. | ............ | 361/118 |

FOREIGN PATENT DOCUMENTS

EP          0 393 635        * 4/1990    ......... H01L/23/485

* cited by examiner

Primary Examiner—Jasmine J Clark

(57) ABSTRACT

An electrical connection device between two conducting tracks of an integrated circuit comprises a first conducting connection between the two tracks. The device further comprises an additional interface of one of the two tracks, different from the interface of the track with the first connection and different from the lateral interface of the track with an insulating material parallel to the flow direction of the electric current in the track. The additional interface is placed at some distance from the first connection which is substantially less than the width of the track. The additional interface may be obtained by placing at least a second conducting connection between the two tracks, or by placing at least one rib in the track, or by placing notches on at least one of the faces of the track.

20 Claims, 3 Drawing Sheets

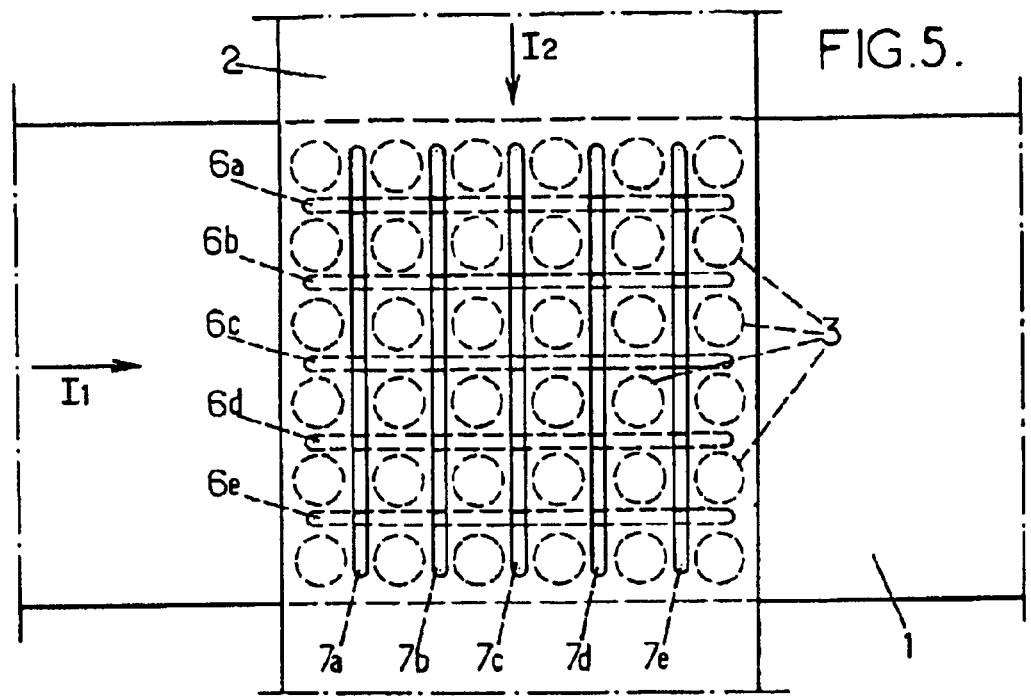
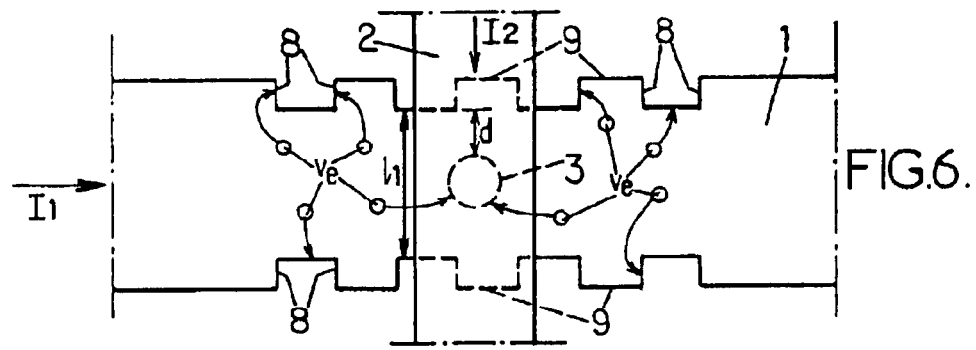
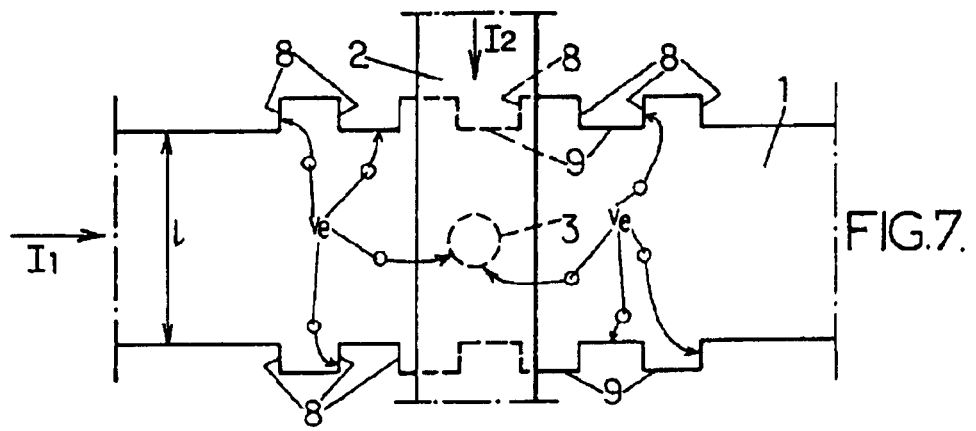

ELECTRICAL CONNECTION DEVICE
BETWEEN TWO TRACKS OF AN
INTEGRATED CIRCUIT

TECHNICAL FIELD OF THE INVENTION

The present invention relates generally to electrical connection devices and, more particularly, to an electrical connection device between two conducting tracks of an electric circuit.

BACKGROUND OF THE INVENTION

In an integrated electronic circuit made on the surface of a substrate, it is often necessary to electrically connect together two conducting tracks placed in superimposed parallel planes lying above the surface of the substrate. To do this, the tracks are placed so that their respective projections onto the substrate surface have common portions, especially when the tracks cross over each other. A conducting connection is then placed between the two tracks, which provides an electrical connection between the two tracks in the direction perpendicular to the substrate surface.

Such a connection is known by the term "via", in the jargon of a person skilled in the art. A "via" comprises a substantially cylindrical part with an axis perpendicular to the substrate surface, which is in contact with each of the two tracks. This cylindrical part is particularly small, with a section of about 0.1 micrometres at the interface with each track, parallel to the substrate surface, and about 0.5 micrometres along the direction perpendicular to the substrate surface. These dimensions are associated with the method of producing the connection.

The conducting tracks are made of a metal, such as copper or aluminium for example. The density of these tracks is often less than the theoretical density of the same bulk material, so that the tracks may be subject to contraction of their constituent material, a contraction especially caused by thermal phenomena, in particular by heating. Such phenomena occur especially during fabrication of the electric circuit or subsequently, during use of the circuit. This contraction may cause a hole to form in the track. Typically, such a hole is formed at the interface between the connection and the track. The electrical continuity between the two tracks may then be broken, which may prevent the correct operation of the electric circuit. In some cases, the electrical continuity is not broken, but the electrical resistance between the connection and the track is increased by the presence of the hole. The reliability of the electrical circuit is then reduced, especially due to electromigration effects.

More specifically, after producing the tracks, the material of the tracks has a porosity, such that elementary voids are present distributed throughout the material. These elementary voids may in particular be porosity holes, or else structural vacancies in the material on an atomic scale. Elementary voids may also be generated by stresses in the material of the tracks, which result from differential expansions between the material of the tracks and a material outside the tracks, especially an insulating material within which the tracks are placed. Such elementary voids especially appear when the material of the tracks and the insulating material have different respective thermal expansion coefficients. Other types of elementary voids may be present, but their nature and their origin can sometimes be difficult to identify.

It has been observed that the elementary voids have a certain mobility within the conducting material of the tracks, and especially that they move in order to come together at preferential sites, forming a larger void at this location. Sites at which elementary voids of one of the tracks come together are, for example, junctions between the grains of the track material, or locations on the surface of this track which have particularly high local stresses. This is particularly the case at an edge belonging to an interface between a track and a material surrounding the track, which is harder or more elastic than the material of the track itself, or at a smaller interface between the track and a material outside the track, different from the material surrounding the track.

The interface between a connection and a track is therefore a favoured site for elementary voids to come together. Consequently, a void of dimensions comparable to the section of the connection may appear at this interface. When a large number of elementary voids are involved in the formation of a localized void at the interface with the connection, the electrical contact between the connection and the track may be broken. This loss of electrical contact takes place all the more quickly the smaller the connection, especially for electronic circuits with a high integration level, and all the more quickly when the track is wide, and therefore likely to contain a large number of elementary voids.

SUMMARY OF THE INVENTION

One aim of the present invention consists in reducing the probability of void formation at the interface between a connection and a conducting track.

Thus the invention provides an electrical connection device between a first conducting track and a second conducting track of an integrated electric circuit, which comprises a first conducting connection between the first track and the second track. The first track has a first interface with the first connection and the second interface with an insulating material laterally surrounding the first track, said second interface being substantially parallel to a flow direction of an electric current in the first track. The first track further comprises at least one additional interface with a material outside the first track and the first connection, placed at some distance from the first connection which is substantially less than a width of the first track at the first interface. Conventionally, the width of a track is measured in a direction perpendicular to the flow direction of the current in the track, and parallel to the substrate surface.

Thus, the electrical connection device has one or more additional interfaces at which the elementary voids present within the first track may come together. The elementary voids are then distributed between more sites, at the additional interface or interfaces as well as the interface between said first connection and the first track, so that the void which may form at said first connection is smaller. The result of this is that the probability of electrical continuity breaking between the two tracks decreases, this being all the more so the larger the dimensions of the additional interface. The reliability of the circuit is thus increased.

This decrease in the probability of breaking the electrical continuity between the two tracks has been observed when the additional interface or interfaces are placed close to said first connection. A distance between at least one of the additional interfaces and the first connection which is less than a width of the first track at the first connection appears preferable for observing a substantial decrease in said probability.

The additional interface added according to the invention may be of at least two different types. According to a first embodiment, the additional interface is obtained by adding a second conducting connection between the two tracks. This is then an interface between said first track and the second connection. If this interface is small, it forms a favoured site for the elementary voids to come together. In particular, the first and second connections may be identical, that is to say made of the same material and having substantially equal dimensions. The respective diffusion probabilities of a given elementary void towards the interface of one of the two connections with the track are then each equal to half the diffusion probability of this elementary void towards the interface with the first connection in a configuration where only the first connection is present. The probability of loss of electrical contact between the track and the first connection is thus correspondingly reduced.

According to a second embodiment, the additional interface is an interface between the first track and an insulating material. Such an additional interface may be in particular obtained by adding features at said second interface. Such features form additional interface portions with respect to said second interface. Since said second interface is substantially parallel to a flow direction of an electric current in the first track, the additional interface portions may be differently oriented. These additional interface portions between the track and the insulating material form additional sites for the elementary voids to come together. In the same way as in the first embodiment, the probability of loss of electrical contact between the track and the first connection is therefore reduced.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

Other particular features and advantages of the present invention will become apparent in the description below of non-limiting exemplary embodiments, with reference to the appended drawings, in which like reference numerals represent like parts, in which:

FIG. 5 shows a variant of the connection device of FIG. 4;

FIG. 6 shows a connection device between two conducting tracks according to a third embodiment of the present invention; and FIG. 7 shows a variant of the connection device of FIG. 6.

DETAILED DESCRIPTION OF THE INVENTION

FIGS. 2 through 7, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged electrical connection device.

For the sake of clarity, the dimensions of the various circuit parts shown in the figures are not in proportion with the actual dimensions. Identical references indicated on several figures correspond to identical elements. The terms "upper", "lower", "over" and "under" used hereinbelow are defined with reference to a common direction D indicated in FIGS. 1 and 2, perpendicular to the tracks.

Figure 1:
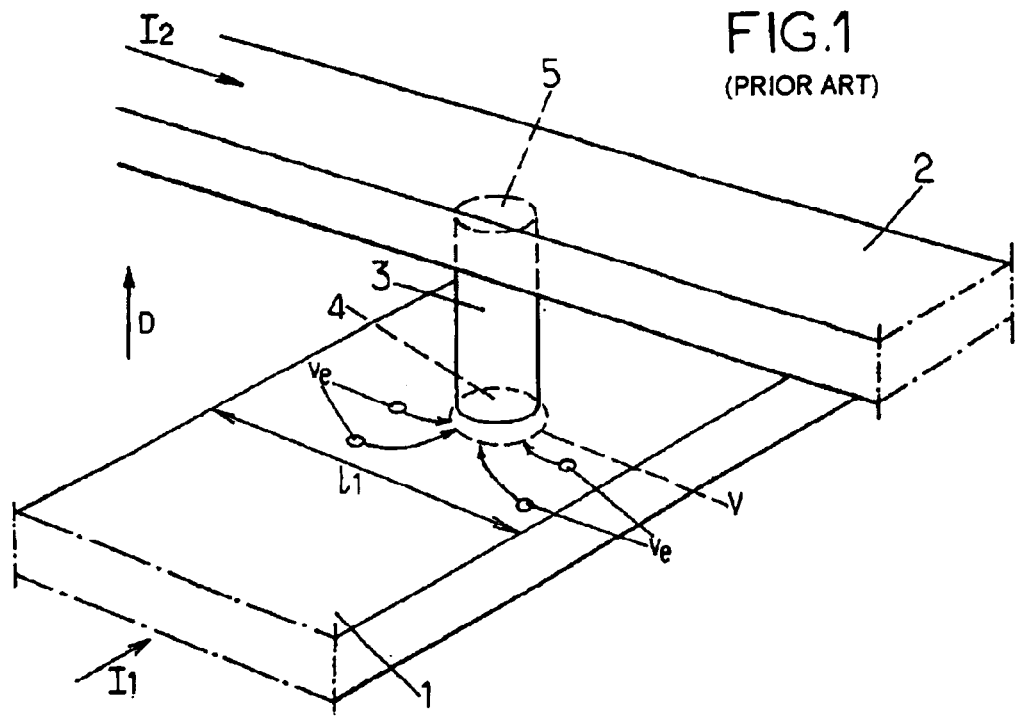
FIG. 1 is a perspective view of a connection device between two conducting tracks according to the PRIOR ART

According to FIG. 1 relating to a device of the prior art, a connection between two tracks 1 and 2 is made by means of a connection 3, or "via". Each of the tracks 1 and 2 is, for example, straight and placed at different levels in the direction D. Each of the two tracks 1 and 2 may have rectangular sections in planes perpendicular to the respective flow directions of electric currents I1 and I2 in each track. They have a width of about 0.1 to 20 micrometres, and a thickness (in the direction D) of about 0.5 micrometres. The tracks 1 and 2 are not in contact with each other, but have respective portions superimposed on each other in the direction D. The connection 3 consists, for example, of a cylinder with an axis parallel to the direction D, placed between said portions of superimposed tracks. The connection 3 is thus in contact with the track 1 by means of an interface 4 located in the upper face of the track 1, and with the track 2 by means of an interface 5 located on the lower face of the track 2. The width $l_1$ indicated in FIG. 1 is the width of the track 1 at the interface 4.

The tracks 1 and 2 and the connection 3 may be made according to the "Damascene" method, well known to a person skilled in the art. In this method, the tracks 1 and 2 and the connection 3 are made within insulating layers superimposed in the direction D above a substantially flat substrate (not shown). For this, each layer is etched through a lithography mask which has an opening corresponding to a section, in a plane perpendicular to the direction D, of one of the elements from among the track 1, the connection 3 and the track 2. Volumes etched in this way are filled with metal, using a process which comprises, for example, an electrolytic deposition step, known to a person skilled in the art. The mask is removed, and polishing is carried out in order to remove the excess metal deposited. The following insulating layer is then produced.

The tracks and connections made in this way are placed within the electrically insulating material of the various layers. This insulating material may have any chemical composition. In particular, it may comprise silicon atoms combined with other atoms, for example oxygen, carbon, fluorine, etc., so as to provide it with insulating electrical behaviour. In particular, it may be silica. The insulating material may also be a material which is organic or based on carbon atoms, such as, for example, a compound comprising carbon and fluorine atoms, known by the name of "Teflon".

The tracks 1 and 2 are made of a metal, which could be, for example, based on copper, aluminium, silver or an alloy containing at least one of the above metals. When this metal is deposited as mentioned above, it has a density less than the theoretical density of the same bulk material ("bulk density"). By way of example, the actual density is about 83% to 98.6% of its theoretical density. Elementary voids, denoted by $v_e$ in FIG. 1, are therefore present, for example within the track 1, which may diffuse and come together at particular locations, thereby forming a larger void at this location. The interface 4 is such a location for the elementary voids $v_e$ to come together, so that a larger void, denoted V in FIG. 1, may develop from the interface 4. The electrical resistance between the track 1 and the connection 3 is therefore increased and, if the void V is large enough with respect to the interface 4, it causes breaking of the electrical contact between the track 1 and the connection 3.

Various examples of implementational modes of the invention are described hereinbelow. They comprise the elements of FIG. 1, and are obtained according to the corresponding fabrication method. Each of these implementational modes corresponds to a modification of the configuration of the connection device of FIG. 1, for the purpose of reducing the void volume V with respect to the dimension of this void volume V in this configuration.

Figure 2:
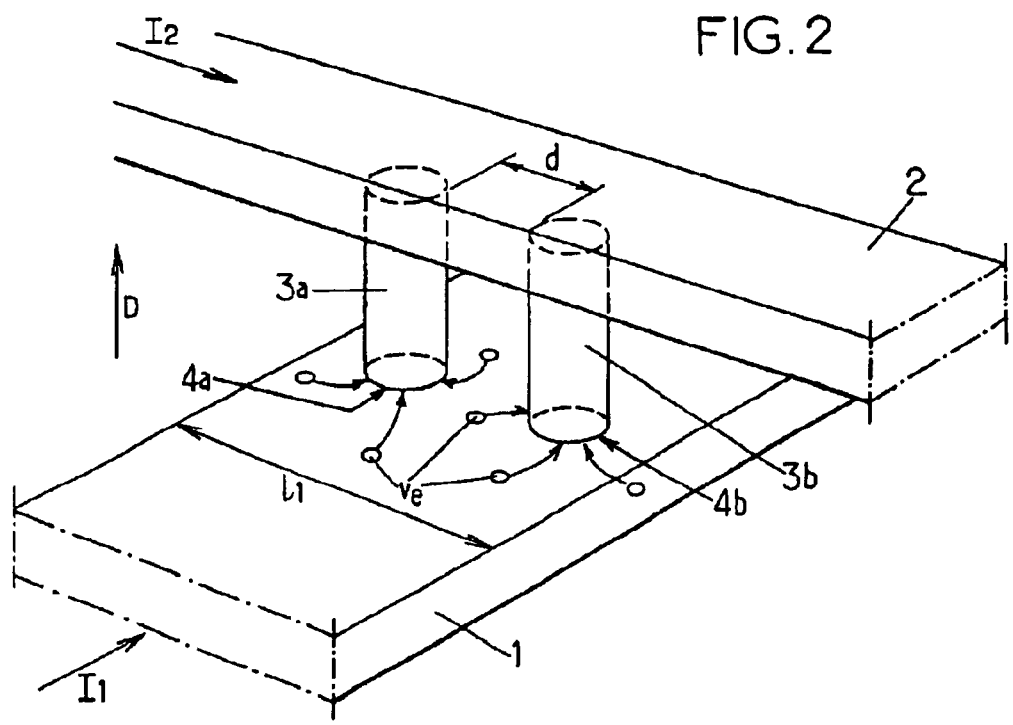
FIG. 2 is a perspective view of a connection device between two conducting tracks according to a first embodiment of the present invention.

FIG. 2 illustrates a first exemplary implementational mode of the invention. According to this first implementational mode, two connections 3a and 3b, each one identical to the connection 3 of FIG. 1, are placed close to each other along a width of the track 1. For this, it may possibly be necessary to increase the width of the track 1 at these connections 3a and 3b. The distance d separating the two connections 3a and 3b is then less than the width $l_1$ of the track 1. The two interfaces 4a and 4b, of the connections 3a and 3b, respectively, with the track 1, each form a particular location for the elementary voids $v_e$ to come together, so that each elementary void $v_e$ diffuses either to the interface 4a or to the interface 4b. The resulting void volumes then develop at each of the interfaces 4a and 4b, respectively, at half the growth rate obtained for the electrical connection configuration of FIG. 1, so that the final sizes reached are smaller. The risk of loss of electrical continuity between the tracks 1 and 2 is reduced. This risk is almost removed when these dimensions are small enough.

To further reduce the risk of loss of electrical continuity between the tracks 1 and 2, more than two connections may be placed between the tracks 1 and 2. In particular, the connections may be distributed both along the width of the track 1 and in the flow direction I1 of the electric current in the track 1.

Figure 3:
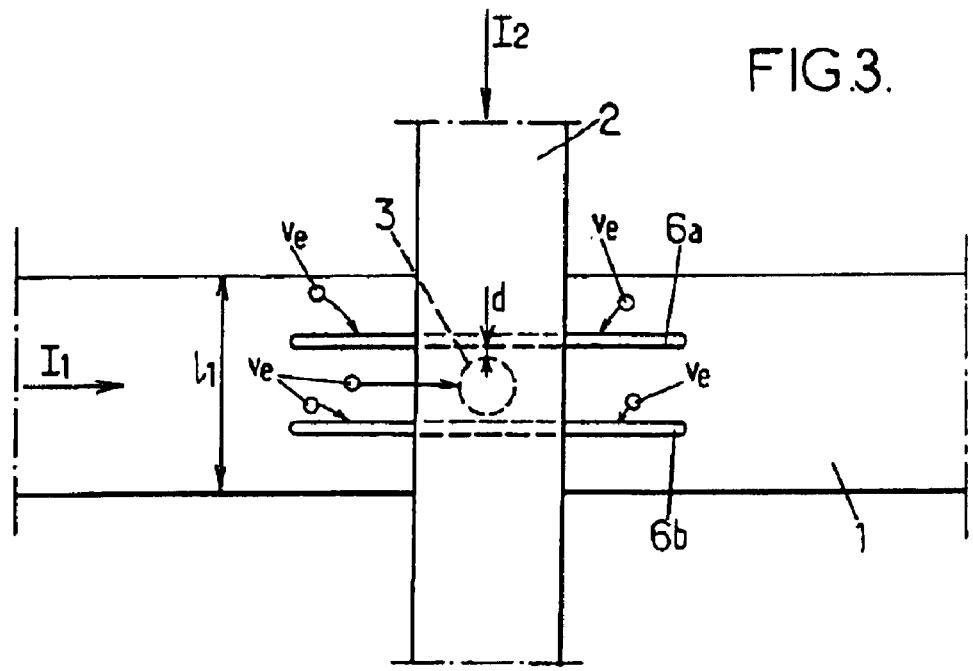
FIG. 3 shows a connection device between two conducting tracks according to a second embodiment of the present invention.

FIG. 3 illustrates a second implementational mode of the invention. According to this second implementational mode, two ribs 6a and 6b made of an insulating material are placed in a track 1, parallel to the flow direction I1 of current. For example, this is the same material as that which surrounds the track 1. The ribs 6a and 6b are, for example, placed on each side of the connection 3, on the same upper face of the track 1 as the connection 3. To obtain maximum efficiency, the connection 3 is located approximately in the middle of the ribs 6a and 6b.

The surface of the ribs 6a and 6b forms an additional interface in the sense of the present invention. The distance d between the connection 3 and the rib 6a is less than the width $l_1$ of the track 1.

Given that some of the elementary voids $v_e$ present in the track 1 may diffuse towards sites where they come together, sites located at the surface of ribs 6a and 6b, the number of elementary voids which reach the interface between the connection 3 and the track 1 is reduced compared with the configuration of FIG. 1.

Optionally, only one of the two ribs is enough to achieve the effect of the invention. However, the result is still more satisfactory with two ribs, placed one on each side of the connection 3.

According to an improvement of the second implementational mode, the ribs 6a and 6b cross the track 1 between its upper and lower faces. In this case, an elementary void $v_e$ initially present in the track 1 on the same side of one of the two ribs opposite the connection 3 cannot diffuse until reaching the interface between the connection 3 and the track 1. Thus the volume of the track 1, from which elementary voids reaching the interface of the connection 3 with the track 1 may originate, is reduced. An additional decrease in the probability of breaking the electrical continuity between the tracks 1 and 2 is thus obtained.

Figure 4:
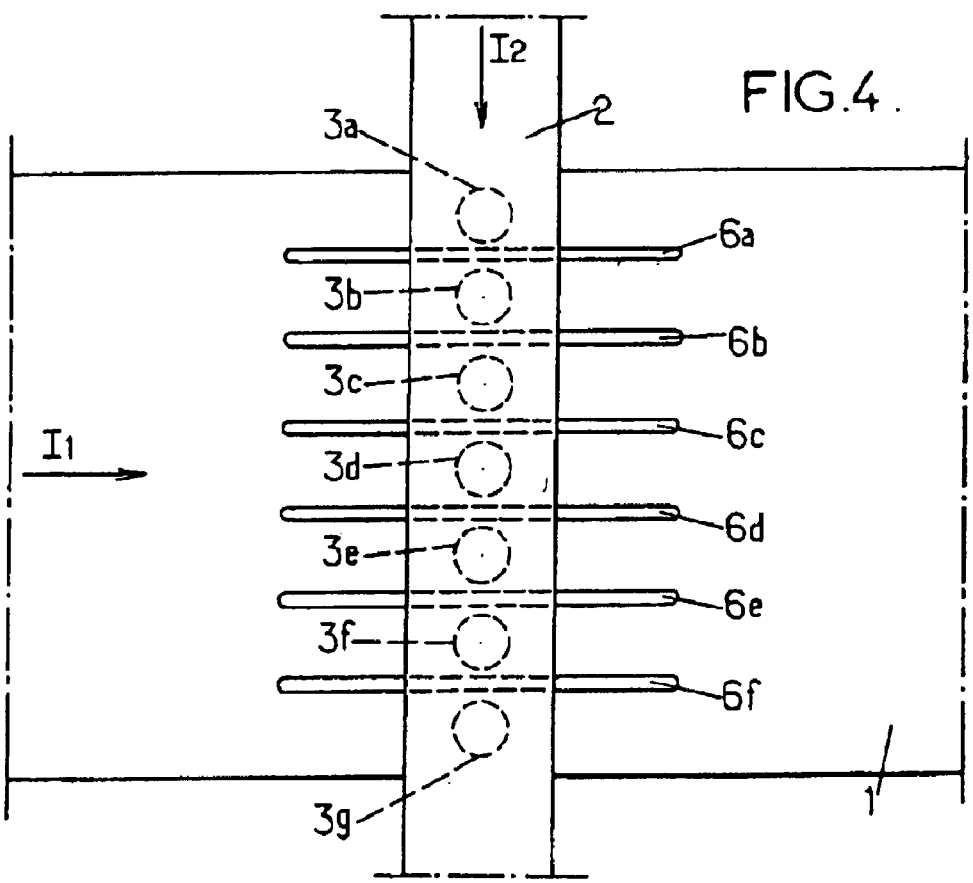
FIG. 4 shows a connection device between two conducting tracks according to a combination of the first and second embodiments.

The connection device of FIG. 4 corresponds to a combination of the devices of FIGS. 2 and 3. More than two ribs of the insulating material surrounding the track 1, for example six ribs 6a–6f, enter the track 1 at regular intervals along the width of the track 1. The six ribs 6a–6f are each parallel to the direction I1. The ribs 6a–6f may be identical to each other. A connection 3a is then placed between a first edge of the upper surface of the track 1 and the rib 6a, connections 3b–3f are placed respectively between two successive ribs, and the connection 3g is placed between the rib 6f and the second edge of the upper face of the track 1. The saving in terms of decreasing the probability of breaking the electrical continuity between the tracks 1 and 2 is then a combination of the savings corresponding to the configurations of FIGS. 2 and 3, respectively.

Optionally, the total width of the track 1 may be increased locally at the ribs 6a–6f so as to compensate for the sections of ribs perpendicular to the direction I1. Such an arrangement makes it possible to obtain a constant flow cross section for the electric current over the entire length of the track 1. This then avoids the appearance of heating caused by local increases in current density, which would promote the diffusion of elementary voids.

Several connections between the tracks 1 and 2 may also be placed between two adjacent ribs or between a rib and one edge of the upper face of the track 1. Preferably, such connections are aligned in the direction I1, and the width of the track 2 may correspondingly be locally adapted.

The electrical connection device of FIG. 5 results from applying the principle of FIG. 4 symmetrically for each of the tracks 1 and 2. Thus, the track 2 is entered by at least one insulating rib placed at a distance from a connection which is substantially less than a width of the second track at this connection. In FIG. 5, five ribs 7a–7e are placed in the track 2. Each rib is parallel to the flow direction I2 of the electric current in the track 2 and crosses the track 2 between its lower and upper faces. Connections 3 are then placed between the tracks 1 and 2, such that at least one of the ribs 6a–6e separates any two connections at their respective interfaces with the track 1, and such that at least one of the ribs 7a–7e separates any two connections at their respective interfaces with the track 2. When the flow directions I1 and I2 of current in the tracks 1 and 2 are substantially perpendicular to each other, all the connections 3 form a matrix which is intercalated row by row with the ribs 6a–6e of the track 1 in the direction I2, and intercalated row by row with the ribs 7a–7e of the track 2 in the direction I1.

In a third implementational mode illustrated in FIG. 6, the edges of the track 1 are arranged in the form of notches extending over the entire height of the track 1 in the direction D which is perpendicular to the plane of FIG. 6. These notches comprise, on the one hand, faces 9 parallel to the direction I1, which correspond to the interface between the track 1 and the insulating material which surrounds it, present in the configuration shown in FIG. 1 and known from the prior art. They further comprise faces perpendicular to the direction I1, referenced 8 in FIG. 6, intercalated between the faces 9. The faces 8 form additional interface portions. Some of the additional interface portions 8 are located at a distance d from the connection 3 which is less than the width $l_1$ of the track 1. They have sites for the additional elementary voids $v_e$ to come together with respect to the sites present on the faces 9. Consequently, the number of elementary voids $v_e$ which diffuse in the direction of the interface between the connection 3 and the track 1 is decreased in proportion to the area of the additional interface portions provided by the notched structure, according to the principle of the invention.

FIG. 7 shows a variant of the configuration of FIG. 6, in which the notches are placed outside the track 1, with respect to the width 1 of the track 1 in a portion of the track 1 away from the connection 3. Such a configuration makes it possible to retain an effective width for the flow of current I1 which is constant over the entire length of the track 1.

It is of course understood that the third implementational mode of the invention, consisting in placing notches on some of the faces of the track 1 in the electrical connection region of the track 1 with the track 2, may advantageously be combined with the first or the second embodiment.

From the foregoing it will be appreciated that, although specific exemplary embodiments of the invention have been described herein for purposes of illustration, various changes and modifications may be made or suggested to one skilled in the art without deviating from the scope of the invention. Accordingly, the invention is not limited except as by the appended claims. It is intended that the present invention encompass such changes and modifications as fall within the scope of the appended claims.

What is claimed is:

1. An electrical connection device between a first conducting track and a second conducting track of an integrated circuit comprising a first conducting connection between the first track and the second track, the first track having a first interface with the first connection and a second interface with an insulating material laterally surrounding the first track, said second interface being substantially parallel to a flow direction of an electric current in the first track, the first track further comprising at least one additional interface with an insulating material, placed at a distance from the first connection which is substantially less than a width of the first track at the first interface.

2. A device according to claim 1, wherein the additional interface comprises a surface of a rib of insulating material included in the first track.

3. A device according to claim 2, wherein the rib is parallel to the flow direction of an electric current in the first track.

4. device according to claim 3, wherein the additional interface comprises surfaces of several ribs of insulating material included in the first track, parallel to each other and to the flow direction of an electric current in the first track.

5. A device according to claim 4, comprising several connections between the first track and the second track, and wherein at least two interfaces between the first track and two respective connections are separated by at least one rib included in the first track.

6. A device according to claim 2, wherein the rib included in the first track cross the first track between two opposite faces of the first track, in a direction perpendicular to the first track and to the second track.

7. A device according to claim 1, wherein the second track comprises at least one rib of insulating material placed at some distance from the first connection which is substantially less than a width of the second track at its interface with the first connection.

8. A device according to claim 7, wherein the second track comprises several ribs of insulating material parallel to each other and to a flow direction of an electric current in the second track.

9. A device according to claim 5, wherein the second track also comprises several ribs of insulating material parallel to each other and to a flow direction of an electric current in the second track, and wherein at least two interfaces between the second track and the two respective connections are separated by at least one rib included in the second track.

10. A device according to claim 7, wherein the rib included in the second track cross the second track between two opposite faces of the second track.

11. A device according to claim 1, wherein the additional interface comprises faces of notches inserted between portions of the second interface.

12. A device according to claim 11, wherein the faces of notches inserted between portions of the second interface are substantially perpendicular to the flow direction of electric current in the first track.

13. A device according to claim 11, further comprising a second conducting connection between the first track and the second track placed at some distance from the first connection which is substantially less than the width of the first track at the first interface.

14. A device according to claim 1, wherein the insulating material includes silicon atoms.

15. A device according to claim 1, wherein the insulating material includes carbon and fluorine atoms.

16. A device according to claim 1, wherein at least one of the materials of the first track, of the second track or of the connection or connections is based on copper, aluminum, silver or an alloy containing at least one of the above metals.

17. An electrical connection device between a first conducting track and a second conducting track of an integrated circuit comprising a first conducting connection between the first track and the second track, and at least one additional second conducting connection between the first track and the second track, wherein said at least one additional second conducting connection is placed at a distance from the first conducting connection that is substantially less than a width of the first track.

18. A device according to claim 17 wherein the first conducting connection has a first interface with the first track that receives a first portion of elementary voids that diffuse within the first track and wherein the second conducting connection has a second interface with the first track that receives a second portion of elementary voids that diffuse within the first track.

19. A device according to claim 17 comprising a plurality of additional conducting connections placed along the width of the first track.

20. A device according to claim 17 comprising a plurality of additional conducting connections placed along the first track in a direction of the flow of electric current through the first track.

* * * * *

UNITED STATES PATENT AND TRADEMARK OFFICE
CERTIFICATE OF CORRECTION

PATENT NO. : 6,917,116 B2
DATED : July 12, 2005
INVENTOR(S) : Srdjan Kordic, Celine Roussel and Alain Inard It is certified that error appears in the above-identified patent and that said Letters Patent is hereby corrected as shown below:

Column 7,
Line 39, insert -- A -- before "device".

Signed and Sealed this

Third Day of January, 2006

JON W. DUDAS
*Director of the United States Patent and Trademark Office*